United States Patent [19]

Jackson

[11] 4,045,255
[45] Aug. 30, 1977

[54] DIRECTIONALLY SOLIDIFIED EUTECTIC $\gamma+\beta$ NICKEL-BASE SUPERALLOYS

[75] Inventor: Melvin R. Jackson, Schenectady, N.Y.

[73] Assignee: The United States of America as represented by the Administrator of the National Aeronautics and Space Administration, Washington, D.C.

[21] Appl. No.: 691,936

[22] Filed: June 1, 1976

[51] Int. Cl.² .............................................. C22C 19/03
[52] U.S. Cl. ........................................ 148/32; 75/170
[58] Field of Search ................... 148/32, 32.5; 75/170, 75/171

[56] References Cited

U.S. PATENT DOCUMENTS 3,944,416  3/1976  Walter .................................. 148/32

*Primary Examiner*—R. Dean
*Attorney, Agent, or Firm*—Norman T. Musial; John R. Manning

[57] ABSTRACT

A directionally solidified multivariant eutectic $\gamma+\beta$ nickel-base superalloy casting having improved high temperature strength and oxidation resistance properties is provided comprising a two phase eutectic structure containing, on a weight percent basis, 5.0–15.0 tungsten, 8.5–14.5 aluminum, 0.0–35.0 cobalt and the balance being nickel. Embedded within the $\gamma$ phase nickel-base matrix are aligned eutectic $\beta$ phase (primarily (Ni,Co)Al reinforcing lamellae.

12 Claims, 2 Drawing Figures

DIRECTIONALLY SOLIDIFIED EUTECTIC $\gamma+\beta$ NICKEL-BASE SUPERALLOYS

The invention described herein was made in the performance of work under a NASA contract and is subject to the provisions of Section 305 of the National Aeronautic and Space Act of 1958, Public Law 85-568 (72 Stat. 435 42 USC 2457).

BACKGROUND OF THE INVENTION

1. Field of the Invention

The present invention relates to directionally solidified multivariant eutectic $\gamma+\beta$ nickel-base superalloy articles and compositions, and more particularly to eutectic articles and compositions which include a $\gamma$ phase nickel-base superalloy matrix reinforced with aligned $\beta$ phase lamellae, primarily nickel-cobalt-aluminum lamellae wherein the $\gamma$ phase is a face-centered-cubic solid solution based on nickel and the $\beta$ phase is a body-centered-cubic (CsCl) ordered intermetallic based on Ni,Co)A1.

2. Description of the Prior Art

The development of directionally solidifying nickel-base superalloys in the gas turbine engine alloy art has reached the point where current advances are based on identifying eutectic nickel-base superalloy compositions since such compositions permit (a) orientation of eutectic phases and (b) inclusion of eutectic phase reinforcing members such as lamellae.

In directionally solidified eutectic alloy composites, the highly desirable strength properties at high temperatures, i.e. greater than 950° C. (1,742° F.) are provided by metallic composite containing aligned lamellae or fibers as a reinforcing phase dispersed in the alloy matrix. In order to improve the high temperature stress rupture and oxidation properties, it is desirable to identify the alloys, especially oxidation resistant eutectic alloys which can be directionally solidified to provide fiber or platelet reinforced superalloy matrices. Although strong oxidation resistant superalloys involving nickel, aluminum and tungsten, alone or with other alloying additions, are known such as the compositions set out by W. J. Waters and J. C. Freche, *Metal Progress* (March 1975) pages 57–60, heretofore the identification of oxidation resistant high strength eutectic alloys that can be directionally solidified which contain nickel, tungsten, aluminum and optionally cobalt has not been defined.

DESCRIPTION OF THE INVENTION

In accordance with the present invention, I have discovered a unidirectionally solidified multivariant eutectic $\gamma+\beta$ nickel-base superalloy casting having improved high temperature strength and oxidation resistance properties comprising a two phase eutectic structure consisting of a matrix of a nickel-base superalloy — having an aligned reinforcing lamellar $\beta$ phase consisting primarily of nickel-alluminum (Ni,A1) embedded in a $\gamma$ phase matrix — containing, on a weight percent basis, 5.0 to 15.0 tungsten, 8.5 to 14.5 aluminum, 0.0 to 35.0 cobalt, and the balance being essentially nickel. A presently preferred superalloy contains, on a weight percent basis, 7.0 to 12.5 tungsten, 9.5 to 12.0 aluminum, 7.0 to 13.0 cobalt, and the balance being essentially nickel. Since the $\gamma$ and $\beta$ phases are in equilibrium, all elements in the alloy are substantially present in both phases. The aforesaid castings contain a substantial volume fraction of a reinforcing $\beta$(Ni,Al) phase which imparts substantial high temperature stress rupture strength to the castings.

In order to obtain the nickel-base superalloys of my invention, my alloys must be unidirectionally solidified to enable (Ni,Al)-rich $\beta$ eutectic lamellae to be formed simultaneously with and be bonded to the reinforced solid solution matrix. The unidirectional solidification can be conducted by one or more of the many methods and using apparatus well-known and widely reported in the art as described by C. T. Sims et al., *The Superalloys*, Wiley & Sons (1972).

The maximum directional solidification rate of my $\gamma$-$\beta$ lamellear eutectics is a function of alloy composition for a fixed thermal gradient. In general, the solidification temperature gradient normally falls within the range of from about 60° C. to about 150° C. per centimeter, and the directional solidification rate falls within the range of from about ¼ in./hr. (0.64 cm./hr.) to about 4 in./hr. (10 cm./hr.) at 80° C. per centimeter of thermal gradient. Since the directional solidification rate and the resultant morphology of my alloys is effected by the composition of my alloys, the expression directional solidification (ds) rate is defined herein and in the appended claims as any rate at which my eutectic alloys may be solidified without formation of undesirable cell or dendrite structures.

The resistance of the $\gamma+\beta$ eutectic structures of my invention to cyclic oxidation exposure (one hour cycles) between 1,100° C. and 200° C. is excellent, as observed by weight change measurements and metallography. In general, after 500 cycles, the weight change of the alloys is equivalent to less than b 5$\mu$ of loss in thickness. Metallography of the alloys shows an adherent protective oxide outer layer adjacent to a $\beta$-denuded surface layer of the substrate, with the majority of the substrate being unaltered.

My invention is more clearly understood from the following description taken in conjunction with the accompanying figures described hereafter:

Figure 1:
FIG. 1 is a photomicrograph of a transverse section of a nickel-base alloy of my invention containing 67.3 Ni, 11.3 Al, 10.8 W and 10.6 Co on a weight percent basis, directionally solidified at 20 mm./hr. The minor lamellar phase is (Ni,Al)-rich $\beta$ eutectic lamellae.
Figure 2:
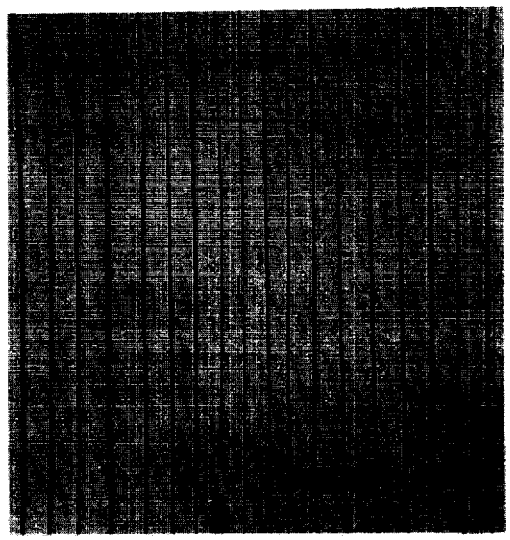
FIG. 2 is a photomicrograph of a longitudinal section of the alloy of composition of FIG. 1.

During the evaluation of the present invention, a number of alloy compositions were evaluated. In the following tables, the alloy compositions and the test results illustrate the breadth and scope of the preferred embodiments of my invention, however they are not to be considered as limiting the invention exclusively thereto.

TABLE I

Eutectic $\gamma$-$\beta$ Nickel-Base Superalloys

| Example | Alloy Composition wt. % | | | | | | | D.S.Rate[1] (mm./hr.) | S.R. at 1100° C.[2] | | | Y.S.[3]/U.T.S.[4] measured in ksi | | |
|---|---|---|---|---|---|---|---|---|---|---|---|---|---|---|
| | Ni | W | Al | Co | Ta | Mo | Re | | ksi | atmos. | hrs. | 23° C. | 750° C. | 1100° C. |
| 1 | 74.0 | 14.5 | 11.5 | — | — | — | — | 20 | 12 | Argon | 1.65 | 74.0/171 | — | 29.0/29 |
| 2 | 75.5 | 13.1 | 11.4 | — | — | — | — | 20 | 12 | " | 1.94 | 91.9/165 | 129/131 | 30.8/30.9 |
| 3 | 66.8 | 11.5 | 11.1 | 10.6 | — | — | — | 20 | 12 | " | 8.67 | 62.5/139 | 103/111 | 38.3/40.8 |

TABLE I-continued

Eutectic γ-β Nickel-Base Superalloys

| Exam- | Alloy Composition wt. % | | | | | | | D.S.Rate[1] | S.R. at 1100° C.[2] | | | Y.S.[3]/U.T.S.[4] measured in ksi | | |
|---|---|---|---|---|---|---|---|---|---|---|---|---|---|---|
| ple | Ni | W | Al | Co | Ta | Mo | Re | (mm./hr.) | ksi | atmos. | hrs. | 23° C. | 750° C. | 1100° C. |
| 4 | 67.2 | 10.9 | 11.3 | 10.6 | — | — | — | 20 | 12 | " | 5.32 | — | — | 41.2/41.2 |
| 5 | 66.8 | 11.5 | 11.1 | 10.6 | — | — | — | 50 | — | — | — | 58.2/132 | 120/120 | 39.4/39.6 |
| 6 | 76.7 | 10.0 | 11.7 | — | 1.6 | — | — | 20 | 12 | Argon | 2.88 | 98.3/173 | 116/130 | 29.2/29.2 |
| 7 | 77.2 | 9.3 | 11.9 | — | 1.6 | — | — | 20 | — | — | — | — | — | 32.5/32.5 |
| 8 | 77.3 | 10.5 | 11.6 | — | — | 0.6 | — | 20 | 12 | Argon | 10.45 | 79.7/137 | 138/164 | 29.6/29.6 |
| 9 | 76.9 | 10.4 | 11.5 | — | — | — | 1.2 | 20 | 11 | Air | 13.24 | 89.1/167 | 119/142 | 39.4/39.4 |

[1]D.S. = Directional Solidification <100° C./cm. thermal gradient
[2]S.R. = Stress Rupture
[3]Y.S. = Yield Strength
[4]U.T.S. = Ultimate Tensile Strength As illustrated by Examples 1–4 of Table I, the addition of cobalt to a eutectic γ-β nickel-base melt composition containing nickel, tungsten and aluminum substantially increases both the yield strength and the ultimate tensile strength of the alloys at 1,100° C. since the cobalt addition causes (1) a large decrease in lamallar spacing, e.g. from about 17–18 to about 10 microns at zero and 10.6 weight percent cobalt, respectively; and (2) a slight increase in the volume fraction of the β phase.

As illustrated by Examples 6–9 of Table I, other alloying additions, such as tantalum, niobium, rhenium and molybdenum, can be made to the eutectic γ+β nickel-base superalloys of my invention. Accordingly, my alloys can contain, on a weight percent basis, 0.0 to 3.0 tantalum and 0.0 to 2.0 niobium in addition to nickel, tungsten, aluminum and optionally cobalt present in amounts as defined hereinbefore. Other alloy modifications can be made to my alloys by the addition, on a weight basis, 0.0 to 2.5 molybdenum and 0.0 to 4.5 rhenium as a replacement for up to a limit of 1.5 atomic percent of tungsten. The method of calculating the atomic percent of each element of the alloy is determined by dividing the weight percent by each elements atomic weight, summing all these values ($\Sigma_{w-a}$) and then dividing each element's weight percent divided by the element's atomic weight value by the sum ($\Sigma_{w-a}$). The addition of molybdenum and/or rhenium as a partial replacement for tungsten leads to a substantial improvement in the stress rupture and ultimate tensile strength of the eutectic γ-β nickel-base alloys of my invention at 1,100° C. as illustrated by the data set out in Table II which follows:

yttrium further improves their oxidation resistance, since yttrium apparently acts to prevent or postpone spallation of a protective alumina layer, thereby prolonging the service life of the alloy. Accordingly, the alloys of my invention can contain, on a weight basis, from 0.0 to 0.5, preferably 0.05 to 0.25 yttrium in addition to nickel, tungsten, aluminum, cobalt, tantalum, niobium, molybdenum and rhenium present in amounts as defined previously. An illustrative example of an alloy of my invention, on a weight basis, which has been directionally solidified at a rate of 20 mm./hr. which contains yttrium is as follows: 68.4 Ni, 9.3 W, 11.4 Al, 10.7 Co and 0.2 Y.

Other elements, such as zirconium and boron, can be added to the eutectic γ+β nickel-base alloys for the purpose of improving grain boundary strengthening and ductility. Accordingly, my alloys can contain, on a weight percent basis, 0.0 to 0.01 boron and 0.0 to 0.1 zirconium, in addition to the other elements present in amounts as described hereinbefore.

My eutectic γ+β nickel-base superalloys can be employed in jet engine turbine vane articles of manufacture and have oxidation resistance greater than that currently provided by presently employed commercial cobalt-base superalloys, such as the General Electric Company's X-40 alloy or Martin Marietta's Mar M 509.

It will be apparent to those skilled in the art that other changes and modifications within the full intended scope of the invention as defined by the appended claims can be made in the particular embodiments of the invention described herein.

I claim:

TABLE II

Eutectic - Nickel-Base Superalloys

| Example | Alloy Composition wt.% | | | | | D.S.Rate[1] | S.R. at 1100° C.[1] | | | U.T.S. at 1100° C.[1] | |
|---|---|---|---|---|---|---|---|---|---|---|---|
| | Ni | W | Al | Mo | Re | (mm./hr.) | ksi | atmos. | hrs. | measured in ksi | $P_{LM}$[2] |
| 10 | 75.5 | 13.1 | 11.4 | — | — | 20 | 12 | Argon | 1.94 | 30.9 | 50.2 |
| 11 | 76.9 | 10.4 | 11.5 | — | 1.2 | 20 | 11 | " | 13.24 | 39.4 | 52.2 |
| 12 | 77.3 | 10.5 | 11.6 | 0.6 | — | 20 | 12 | " | 10.45 | 29.6 | 52.0 |

[1]D.S., S.R. and U.T.S. are the same as described in Table I.
[2]Larson-Miller parameter given by the equation $P = T(C + \log t) \times 10^{-3}$, wherein T is temperature in degrees Rankine, C is equal to 20, and t is the rupture time in hours.

The additions of molybdenum and/or rhenium as set out in Table II result in a slight change in the structure or morphology of the eutectic γ+β nickel-base superalloys of my invention by the addition of a third phase, α-tungsten at grain boundaries and to a lesser extent throughout the grains.

The eutectic γ-β nickel-base alloys have melting points of from about 1,375° to about 1,395° C. and densities of 7.8 to 8.2 grams per cc.

As previously stated, the oxidation resistance during cycling between 1,100° and 200° C. of the eutectic γ-β nickel-base alloys is excellent. However, the addition of 1. An article of manufacture having improved high temperature strength and oxidation resistance properties comprising a directionally solidified multivariant eutectic γ+β nickel-base superalloy casting containing a two phase eutectic structure consisting of a γ phase matrix of a face-centered-cubic solid solution crystal structure based on nickel having embedded in the γ phase an aligned reinforcing lamellar β phase consisting primarily of a nickel-aluminum (Ni,Al) composition which is a body-centered-cubic (CsCl) ordered intermetallic based on NiAl.

2. The claim 1 article wherein said casting consists essentially of, on a weight percent basis, 5.0-15.0 tungsten, 8.5-14.5 aluminum, 0.0-35.0 cobalt and the balance being nickel.

3. The claim 2 article containing 7.0-12.5 tungsten, 9.5-12.0 aluminum, 7.0-13.0 cobalt and the balance being essentially nickel.

4. The claim 2 article containing, on a weight percent basis, 0.0-0.01 boron.

5. The claim 2 article containing, on a weight percent basis, 0.0-0.1 zirconium.

6. The claim 2 article, containing, on a weight percent basis, 0.0-0.5 yttrium.

7. The claim 2 article containing, on a weight percent basis 0.0-2.5 molybdenum as a replacement for tungsten on an atomic ratio basis of about 1:1, up to a limit of 1.5 atomic percent of tungsten.

8. The claim 2 article containing, on a weight percent basis, 0.0-4.5 rhenium as a replacement for tungsten on an atomic ratio basis of about 1:1 up to a limit of 1.5 atomic percent of tungsten.

9. The claim 2 article containing, on a weight percent basis, 0.0-3.0 tantalum.

10. The claim 2 article containing, on a weight percent basis 0.0-2.0 niobium.

11. The claim 1 article consisting essentially of, on a weight percent basis, 10.8 tungsten, 11.3 aluminum, 10.6 cobalt and 67.3 nickel.

12. The claim 6 article, consisting essentially of, on a weight percent basis, 9.3 tungsten, 11.4 aluminum, 10.7 cobalt, 0.2 yttrium and 68.4 nickel.

* * * * *